United States Patent
Yeh

(10) Patent No.: US 8,653,809 B2
(45) Date of Patent: Feb. 18, 2014

(54) MULTI-STATE INDICATOR

(75) Inventor: Chun Wen Yeh, Hsinchu County (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 423 days.

(21) Appl. No.: 13/053,385

(22) Filed: Mar. 22, 2011

(65) Prior Publication Data

US 2012/0056614 A1 Mar. 8, 2012

(30) Foreign Application Priority Data

Sep. 3, 2010 (TW) .............................. 99129972 A

(51) Int. Cl.
*G01R 5/14* (2006.01)
(52) U.S. Cl.
USPC ..................................................... 324/140 R
(58) Field of Classification Search
None
See application file for complete search history.

(56) References Cited

U.S. PATENT DOCUMENTS

2003/0122589 A1* 7/2003 Cowles ........................... 327/74

FOREIGN PATENT DOCUMENTS

| CN | 1618022 A | 5/2005 |
|---|---|---|
| TW | 200908545 | 2/2009 |

OTHER PUBLICATIONS

State Intellectual Property Office of the People's Republic of China, "Office Action", Apr. 3, 2013, China.
Taiwan Patent Office, "Office Action", Aug. 30, 2013.

* cited by examiner

*Primary Examiner* — Jermele M Hollington
*Assistant Examiner* — Trung Nguyen
(74) *Attorney, Agent, or Firm* — WPAT, PC; Justin King

(57) ABSTRACT

A multi-state indicator comprises a voltage generator, for generating M voltages, with M being an integer larger than 3; and a multi-state detector, coupled to the voltage generator, for receiving M voltages, having a voltage input end for receiving an input voltage to generate an indication signal whereby the indication signal is capable of indicating the input voltage with reference to the M voltages. Unlike the prior art, a multi-state detector having level shifters according to the present invention alleviates problems of static currents and over-large areas for circuits implementing typical differential comparators.

13 Claims, 12 Drawing Sheets

| Input Voltage (Vin) | Nodes | | | | Indication Signal |
|---|---|---|---|---|---|
| | S311 | S312 | S313 | S314/Vout | |
| Vdd | Vss | VM | Vss | Vdd | 1 |
| VM | Vss | VM | Vss | Vdd | 1 |
| Vss | VM | Vss | Vdd | Vss | 0 |
| | I31 | I32 | M31 | | |

| Input Voltage (Vin) | Nodes | | | | Indication Signal |
|---|---|---|---|---|---|
| | S321 | S322 | S323 | S324/Vout | |
| Vdd | VM | Vdd | Vss | Vdd | 1 |
| VM | Vdd | VM | Vdd | Vss | 0 |
| Vss | Vdd | VM | Vdd | Vss | 0 |

| Input Voltage (Vin) | S331 | S332 | S333 | S334 | S335 | S336/Vout | Indication Signal |
|---|---|---|---|---|---|---|---|
| Vdd | VML | VMH | Vss | VMH | Vss | Vdd | 1 |
| VMH | VML | VMH | Vss | VMH | Vss | Vdd | 1 |
| VML | VMH | VML | VMH | Vss | Vdd | Vss | 0 |
| Vss | VMH | VML | VMH | Vss | Vdd | Vss | 0 |

Figure 3(f)

| Input Voltage (V$_{in}$) \ Indication Signal | V$_{out3}$ | V$_{out2}$ | V$_{out1}$ |
|---|---|---|---|
| V$_{dd}$ | 1 | 1 | 1 |
| V$_{MH}$ | 0 | 1 | 1 |
| V$_{ML}$ | 0 | 0 | 1 |
| V$_{ss}$ | 0 | 0 | 0 |

Figure 5(d)

MULTI-STATE INDICATOR

CROSS REFERENCE TO RELATED PATENT APPLICATION

This patent application is based on Taiwan, R.O.C. patent application No. 099129972 filed on Sep. 3, 2010.

FIELD OF THE INVENTION

The present invention relates to an indicator, and more particularly, to a multi-state indicator.

BACKGROUND OF THE INVENTION

Generally, a multi-state indicator is used to represent a voltage of a voltage input end in the digital format. Please refer to FIG. 1(a) and FIG. 1(b). FIG. 1(a) and FIG. 1(b) are schematic diagrams of operational segments and circuits of a three-state indicator 100 according to the prior art. When the three-stage indicator 100 is applied to a circuit having a voltage distributed from $V_{ss}$ to $V_{dd}$ ($V_{dd}>V_{ss}$), the three-stage indicator 100 determines that an input voltage $V_{in}$ is $V_{dd}$, $V_M$, or $V_{ss}$, and puts the input voltage $V_{in}$ into a two-bit indication signal ($V_{out2}$, $V_{out1}$), i.e., the indication signal ($V_{out2}$, $V_{out1}$) is represented in the digital indication signal output "1/0" format, so as to be provided to subsequent circuits.

Please refer to FIG. 1(a), a voltage segment from $V_{dd}$ to $V_{ss}$ is divided into two voltage segments—a first voltage segment I formed between $V_M$ and $V_{ss}$ and a second voltage segment II formed between $V_{dd}$ and $V_M$. A first reference voltage $V_{ref1}$ is selected from the first voltage segment I, and a second reference voltage $V_{ref2}$ is selected from the second voltage segment II. As shown in FIG. 1(b), the first reference voltage $V_{ref1}$ and the second reference voltage $V_{ref2}$ are generated by a reference voltage generator 101, and the voltages $V_{dd}$, $V_{ref2}$, $V_{ref1}$, and $V_{ss}$ are provided to the three-state detector 103. The above voltages are compared with the input voltage $V_{in}$ in the three-state detector 103, and the input voltage $V_{in}$ is determined to be one of the voltages according to the indication signal ($V_{out2}$, $V_{out1}$).

FIG. 2(a) is a schematic diagram of a differential comparator 2. When an input voltage $V_{in2}$ at a positive input end of the differential comparator 2 is larger than an input voltage $V_{in1}$ at a negative input end, a digital indication signal "1" is generated at an output end $V_{out}$ of the differential comparator 2. On the contrary, when the input voltage $V_{in2}$ at the positive input end of the differential comparator 2 is smaller than the input voltage $V_{in1}$ at the negative input end, a digital indication signal "0" is generated at the output end $V_{out}$ of the differential comparator 2.

Please refer to FIG. 2(b). FIG. 2(b) is a schematic diagram of a three-state indicator implemented with two differential comparators in the prior art. The three-state detector 103 of the three-state indicator 100 is composed of a first differential comparator 21 and a second differential comparator 22. The first differential comparator 21 has a positive input end for receiving an input voltage $V_{in}$, a negative input end for receiving a first reference voltage $V_{ref1}$, and an output end for generating the first bit $V_{out1}$ of the indication signal ($V_{out2}$, $V_{out1}$). The second differential comparator 22 has a positive input end for receiving the input voltage $V_{in}$, a negative input end for receiving a second reference voltage $V_{ref2}$, and an output end for generating the second bit $V_{out2}$ of the indication signal ($V_{out2}$, $V_{out1}$).

It can be seen that when the input voltage $V_{in}$ is at the first level $V_{ss}$, the indication signal ($V_{out2}$, $V_{out1}$) is (0, 0); when the input voltage $V_{in}$ is at the second level $V_M$, the indication signal ($V_{out2}$, $V_{out1}$) is (0, 1); when the input voltage $V_{in}$ is at the third level $V_{dd}$, the indication signal ($V_{out2}$, $V_{out1}$) is (1, 1). As shown in FIG. 2(b), since power of the first differential comparator 21 and the second differential comparator 22 is supplied by $V_{dd}$ and $V_{ss}$, the logic "1" of the first differential comparator 21 and the second differential comparator 22 is $V_{dd}$, while the logic "0" is $V_{ss}$.

The approach of implementing the three-state indicator 100 with the differential comparator 2 in the prior art can also be applied to other multi-state indicators. Please refer to FIG. 2(c) and FIG. 2(d) at the same time. FIG. 2(c) and FIG. 2(d) are schematic diagrams of operation segments and circuits of a four-state indicator 200.

As shown in FIG. 2(c), voltage differences of four voltages $V_{ss}$, $V_{ML}$, $V_{MH}$, and $V_{dd}$ (where $V_{ss}<V_{ML}<V_{MH}<V_{dd}$), used for comparison by the four-state indicator 200, are divided into three voltage segments I, II, and III. The first reference voltage $V_{ref1}$ is selected from the first voltage segment I, the second reference voltage $V_{ref2}$ is selected from the second voltage segment II, and the third reference voltage $V_{ref3}$ is selected from the third voltage segment III. As shown in FIG. 2(d), in addition to the three reference voltages $V_{ref1}$, $V_{ref2}$, and $V_{ref3}$ outputted by the reference voltage generator 201, $V_{dd}$ and $V_{ss}$, are supplied to the voltage input end of the four-state detector 203, which comprises three differential comparator circuits 23, 24, and 25. Besides taking $V_{in}$ as input voltages of positive input ends, the differential comparator circuits 23, 24, and 25 respectively take reference voltages $V_{ref1}$, $V_{ref2}$, and $V_{ref3}$ as input voltages of negative input ends, and comparison results of the differential comparator circuits 23, 24, and 25 are taken as an indication signal ($V_{out3}$, $V_{out2}$, $V_{out1}$) generated by the four-state indicator 200. Since power of the differential comparator circuits 23, 24, and 25 is supplied by $V_{dd}$ and $V_{ss}$, the logic "1" outputted by the differential comparator circuits 23, 24, and 25 is $V_{dd}$, while the logic "0" outputted by differential comparator circuits 23, 24, and 25 is $V_{ss}$.

However, circuit design of the conventional differential comparator is rather complex. Once the number of to-be-identified states increase, accordingly, the circuit design complexity increases greatly, resulting in difficulties in the circuit design. An area of the differential comparator is excessively large, causing a significant increment in production cost. In addition, the circuit design of the differential comparator has a static current problem, causing additional power consumption.

SUMMARY OF THE INVENTION

In view of the above issues, one object of the present invention is to provide a multi-state detector realized by a level shifter circuit so as to solve the above problems of static currents and the over-large area prevalent in the prior art.

According to an embodiment of the present invention, a three-state indicator comprises a voltage generator, for generating a first voltage, a second voltage, and a third voltage; and a three-state detector, coupled to the voltage generator, for receiving the first voltage, the second voltage and the third voltage, with the three-state detector having a voltage input end for selectively receiving the first voltage, the second voltage or the third voltage to generate an indication signal whereby the indication signal is capable of indicating an input voltage at the voltage input end.

According to another embodiment of the represent invention, a multi-state indicator comprises a voltage generator, for generating M voltages, with M being an integer larger than 3;

and a multi-state detector, coupled to the voltage generator, for receiving M voltages, having a voltage input end for receiving an input voltage to generate an indication signal whereby the indication signal is capable of indicating the input voltage with reference to the M voltages.

BRIEF DESCRIPTION OF THE DRAWINGS

The following description and figures are disclosed to gain a better understanding of the advantages of the present invention.

FIG. 3(f) is a schematic diagram of relationships of an output voltage of the third type sub-detector module corresponding to nodes and an output voltage with associated indication signal bits.

FIG. 5(d) is a schematic diagram of an output voltage of a four-state detector circuit corresponding to an indication signal in accordance with an embodiment of the present invention.

DETAILED DESCRIPTION OF THE PREFERRED EMBODIMENT

Figure 1A:
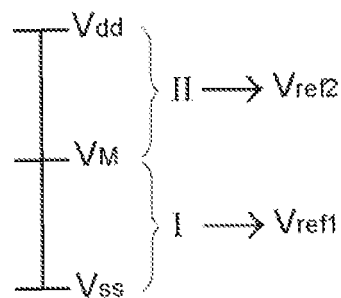
FIG. 1(a) and FIG. 1(b) are respectively a schematic diagram of voltage segments of an output voltage of the conventional third-state indicator and a block diagram of a conventional third-state indicator.
Figure 1B:
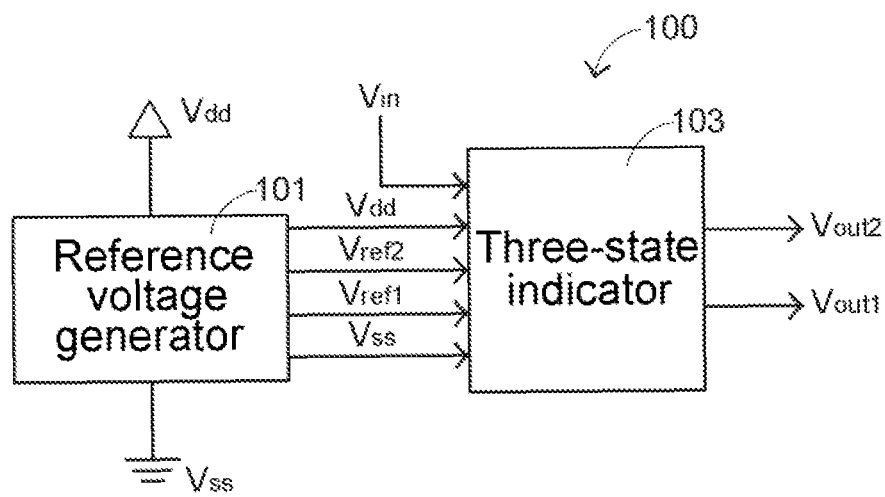
Figure 2A:
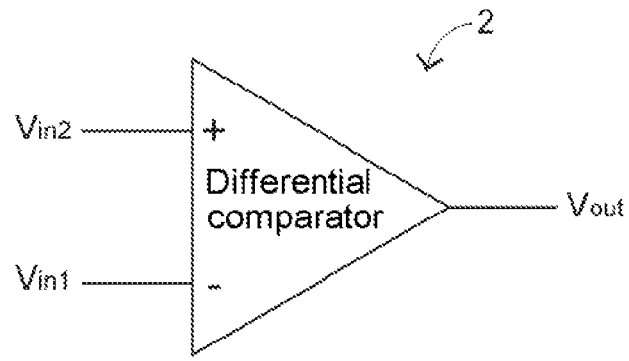
FIG. 2(a) is a schematic diagram of a conventional differential comparator.
Figure 2B:
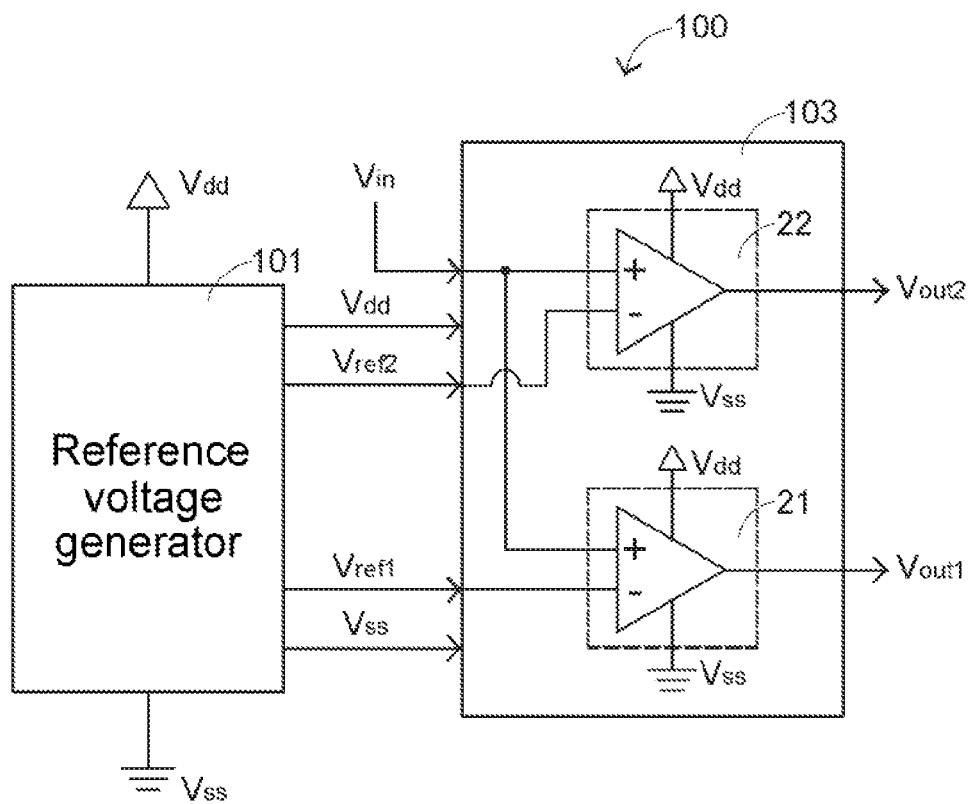
FIG. 2(b) is a schematic diagram of a conventional three-state indicator implemented by two differential comparators.
Figure 2C:
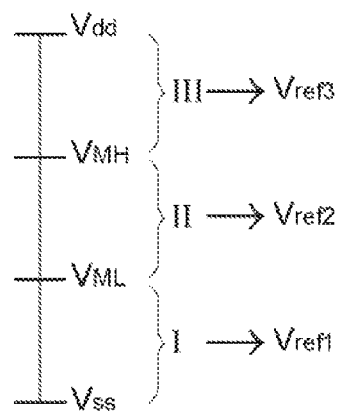
FIG. 2(c) is a schematic diagram of operation segments of a conventional four-state indicator.
Figure 2D:
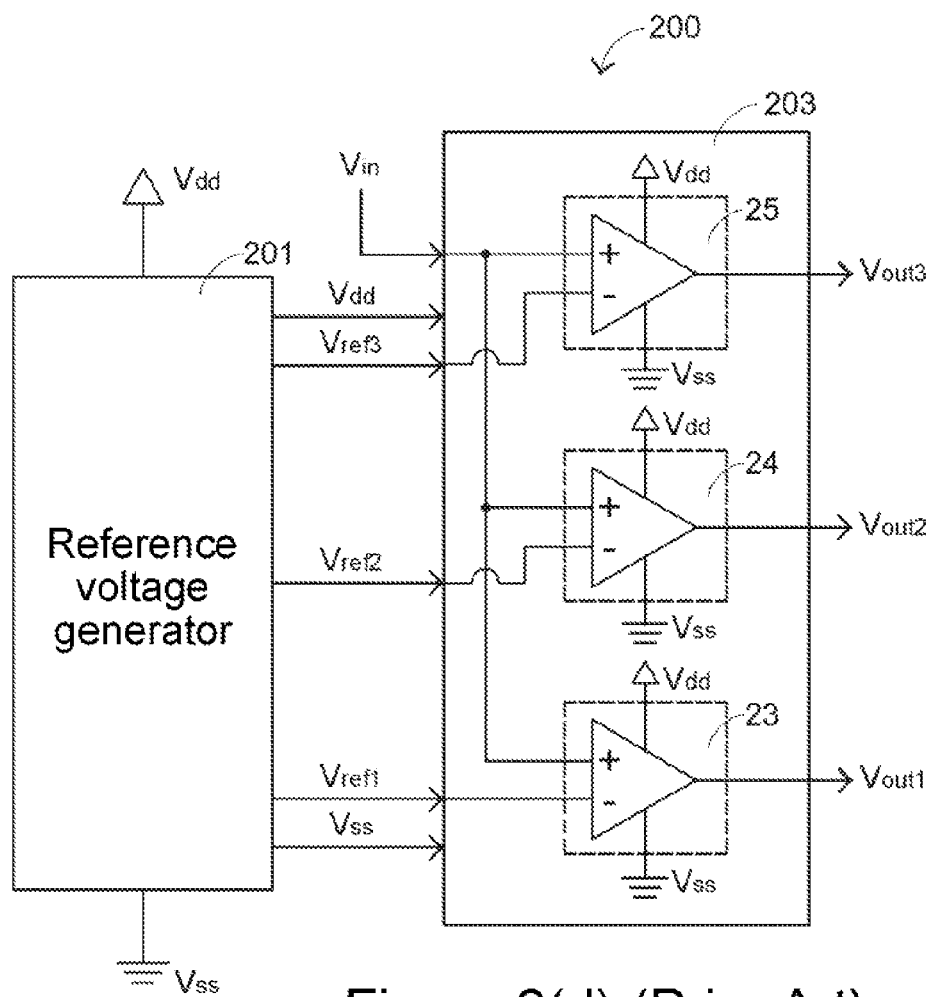
FIG. 2(d) is a schematic diagram of a conventional four-state detector implemented by three differential comparators.

Each of the above multi-state indicators includes a reference voltage generator (the reference voltage generator 101 or the reference voltage generator 201) and a multi-state detector (e.g., the three-state detector 103 or the four-state detector 203) mainly having differential comparators. Since circuits of the differential comparators have problems of static currents and over-large area, a multi-state detector mainly having level shifters according to the present invention is thereby developed to solve the above problems. Since the multi-state detector in accordance with the embodiments of the present invention uses no differential comparators, the conventional reference voltages $V_{ref1}$ and $V_{ref2}$ need not be provided to the three-state detector 103 or the four-state detector 203 for comparison.

Three types of sub-detector modules and timings are described as follows.

Figures 3A, 3B:
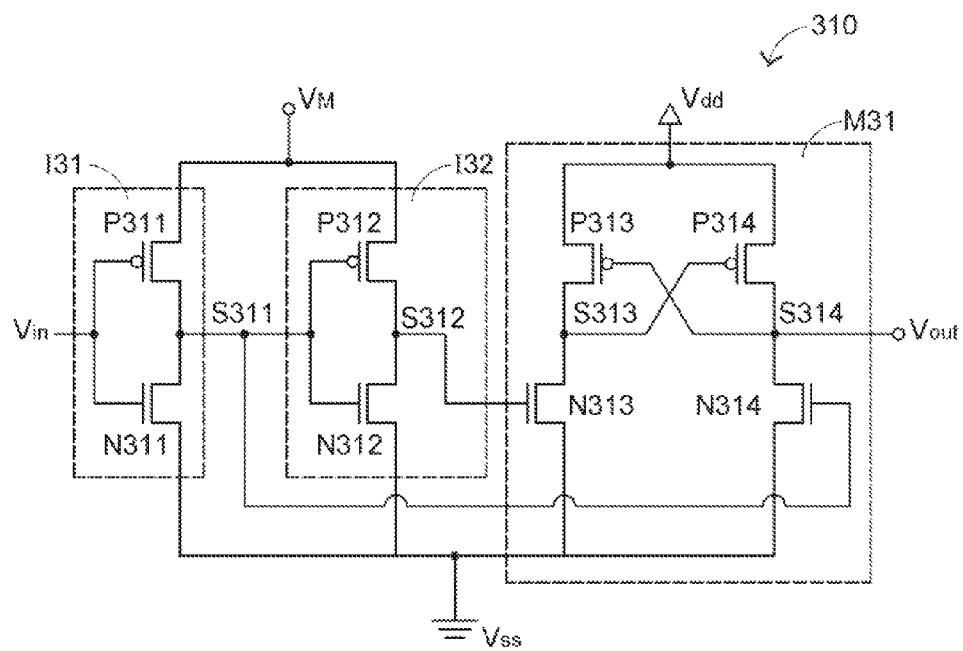
FIG. 3(a) is a schematic diagram of a first type sub-detector module in accordance with an embodiment of the present invention.
FIG. 3(b) is a schematic diagram of relationships of an input voltage of the first type sub-detector module corresponding to nodes and an output voltage with associated indication signal bits.

Please refer to FIG. 3(a). FIG. 3(a) is a schematic diagram of circuits of a first type sub-detector module 310, which has an input voltage $V_{in}$ and a digital output voltage $V_{out}$. Circuits between the input voltage $V_{in}$ and the output voltage $V_{out}$ can be roughly divided into three stages—two inverters I31, I32 and a first type level shifter M31.

The inverter I31 comprises a P-channel metal-oxide-semiconductor field effect transistor (MOSFET) P311, and an N-channel MOSFET N311. The P-channel MOSFET P311 has a source (i.e., a first end) coupled to $V_M$, a gate (i.e., a control end) coupled to the voltage input end $V_{in}$, and a drain (i.e., a second end) coupled to a drain (i.e., a second end) of the N-channel MOSFET N311. The N-channel MOSFET N311 has a gate (i.e., a control end) coupled to the voltage input end $V_{in}$, and a source (i.e., a first end) coupled to $V_{ss}$.

The inverter I32 comprises a P-channel MOSFET P312 and an N-channel MOSFET N312. The P-channel MOSFET P312 has a source coupled to $V_M$, a gate coupled to an output end of the inverter I31, and a drain coupled to a drain of the N-channel MOSFET N312. The N-channel MOSFET N312 has a gate coupled to an output end of the inverter I31, and a source coupled to $V_{ss}$. For brevity, the output ends of the inverters I31 and I32 are respectively defined as a node S311 and a node S312.

The first type level shifter M31 comprises two P-channel MOSFETs P313 and P314, and two N-channel MOSFETs N313 and N314. Sources of the two P-channel MOSFETs P313 and P314 are coupled to $V_{dd}$, and sources of the two N-channel MOSFETs N313 and N314 are coupled to $V_{ss}$. A gate of the P-channel MOSFET P313, a drain of the N-channel MOSFET N314, and a drain of the P-channel MOSFET P314 are connected to a node S314. A gate of the P-channel MOSFET P314, a drain of the N-channel MOSFET N313 and a drain of the P-channel MOSFET P313 are connected to a node S313. A gate of the N-channel MOSFET N313 is connected to the node S312 (i.e., the output end of the inverter I32). A gate of the N-channel MOSFET N314 is connected to the node S311 (i.e., the output end of the inverter I31). The node S314 is connected to the output voltage $V_{out}$ of the first type sub-detector module 310. The input voltage $V_{in}$ is one of $V_{dd}$, $V_M$, and $V_{ss}$, wherein $V_{dd} > V_M > V_{ss}$.

FIG. 3(b) is a table of the input voltage $V_{in}$ of the first type sub-detector module 310 corresponding to voltages of the nodes S311, S312, S313, and S314 and the output voltage $V_{out}$. The nodes S311, S312, S313, and S314 in a row are defined as above. Each row in FIG. 3(b) represents cases of the input voltage $V_{in}$ equal to $V_{dd}$, $V_M$, and $V_{ss}$, respectively. Take the input voltage $V_{in}$ equal to $V_{dd}$ as an example, the voltage of the node S311 is $V_{ss}$, the voltage of the node S312 is $V_M$, the voltage of the node S313 is $V_{ss}$, and the voltage (i.e., the output voltage $V_{out}$) of the node S314 is $V_{dd}$.

As shown in FIG. 3(b), the voltages of the nodes of the inverters I31, I32, and the first type level shifter M31 are respectively enclosed by dashed lines, for denoting the voltages of the nodes of each module when the input voltage $V_{in}$ changes, so as to make clear that when the input voltage $V_{in}$ of the first type sub-detector module 310 is $V_{dd}$ or $V_M$, the output voltage $V_{out}$ is $V_{dd}$, i.e., the digital indication signal bit is "1"; when the input voltage $V_{in}$ is $V_{ss}$, the output voltage $V_{out}$ is $V_{ss}$, i.e., the digital indication signal bit is "0".

The inverters I31 and I32 in a steady state do not generate any static current. When the N-channel MOSFET N313 of the first type level shifter M31 receives $V_M$ at its gate, it is determined that the P-channel MOSFET P313 is completely turned off. When the N-channel MOSFET N314 receives $V_{ss}$ at its gate, it is determined that the N-channel MOSFET N314 is completely turned off. Therefore, the first type sub-detector module 310 in the steady state does not generate any static current.

Figures 3C, 3D:
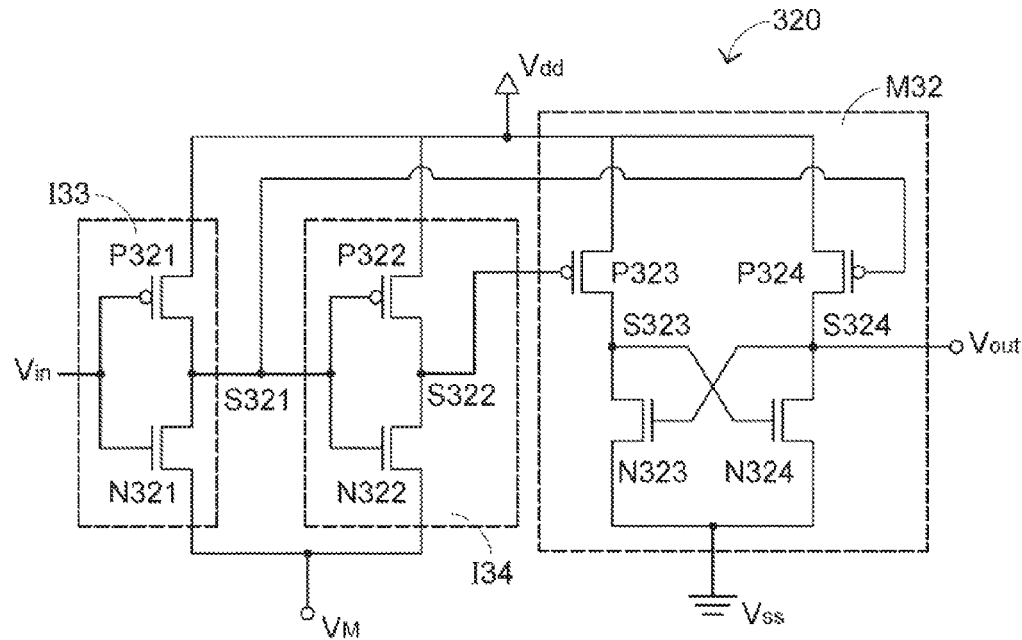
FIG. 3(c) is a schematic diagram of a second type sub-detector module in accordance with an embodiment of the present invention.
FIG. 3(d) is a schematic diagram of relationships of an output voltage of the second type sub-detector module corresponding to nodes and an output voltage with associated indication signal bits.

FIG. 3(c) is a schematic diagram of circuits of a second type sub-detector module 320, which has an input end coupled to a voltage input end for inputting an input voltage $V_{in}$, and an output end for outputting a digital output voltage $V_{out}$. Two inverters I33 and I34 and a second type level shifter M32 are circuits between the voltage input end for inputting the input voltage $V_{in}$ and the output end for outputting the digital output voltage $V_{out}$. The second type sub-detector module 320 comprises four P-channel MOSFETs P321, P322, P323 and P324, and four N-channel MOSFETs N321, N322, N323 and N324. The detailed connections are illustrated in FIG. 3(c) and are omitted herein.

FIG. 3(d) is a table of the input voltage $V_{in}$ of the second type sub-detector module 320 corresponding to voltages of nodes S321, S322, S323, and S324 and the output voltage $V_{out}$. The node S321 in FIG. 3(c) is an output node of the inverter I33, the node S322 is an output node of the inverter I34, and the nodes S323 and S324 are nodes of the second type level shifter M32.

It can be seen from FIG. 3(d) that when the input voltage $V_{in}$ is $V_{dd}$, the corresponding output voltage $V_{out}$ is $V_{dd}$, and when the input voltage $V_{in}$ is $V_M$ or $V_{ss}$, the corresponding output voltage $V_{out}$ is $V_{ss}$. In other words, when the input voltage $V_{in}$ of the second type sub-detector module 320 is $V_{dd}$, the output voltage $V_{out}$ is $V_{dd}$, i.e., the digital indication signal bit is "1"; when the input voltage $V_{in}$ is $V_M$ or $V_{ss}$, the output voltage $V_{out}$ is $V_{ss}$, i.e., the digital indication signal bit is "0".

The inverter I33 and I34 in the steady state do not generate any static current. When the P-channel MOSFET P323 of the second type level shifter M32 receives $V_{dd}$ at its gate, the P-channel MOSFET P323 is completely turned off; when the P-channel MOSFET P324 receives $V_M$ at its gate, the N-channel MOSFET N324 is completely turned off. Therefore, the second type sub-detector module 320 in the steady state does not generate any static current.

Figure 3E:
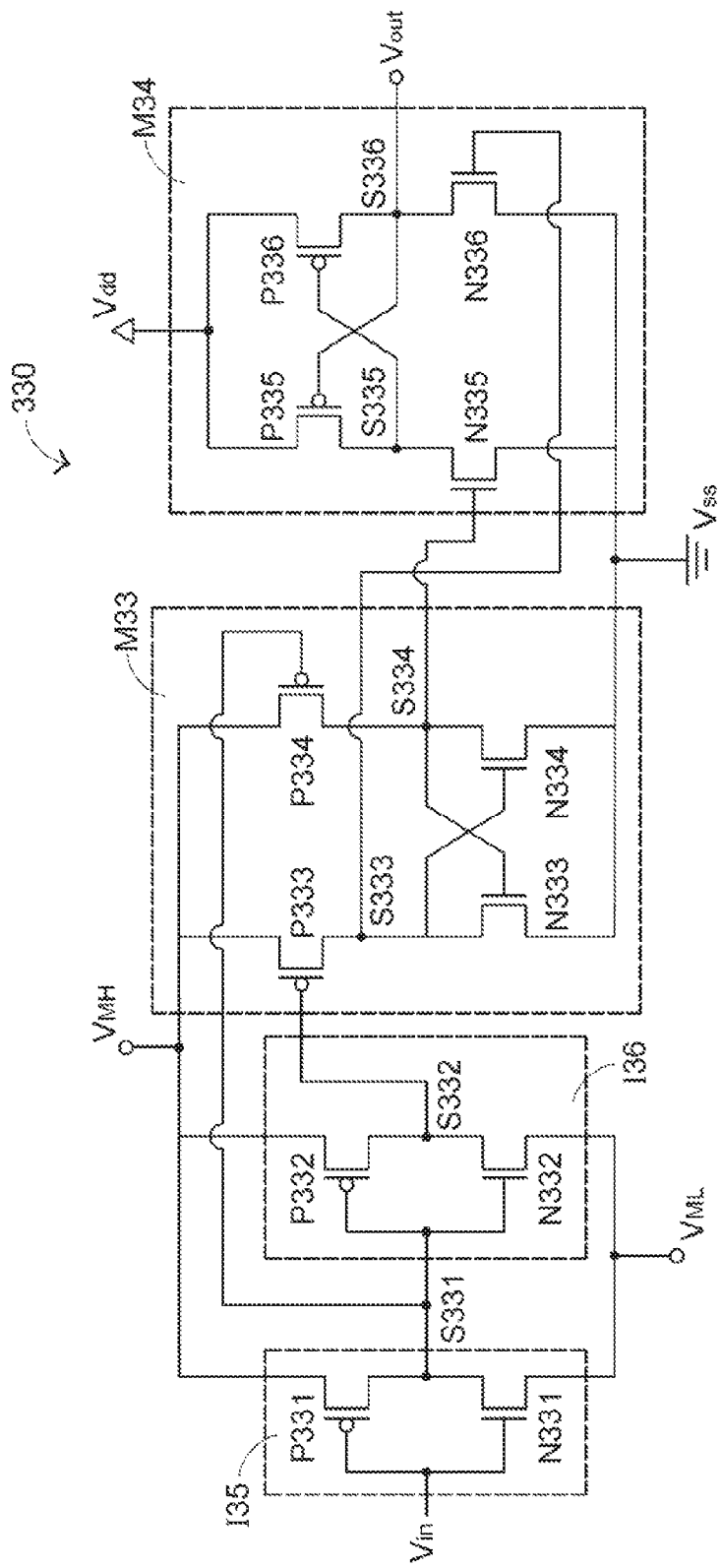
FIG. 3(e) is a schematic diagram of a third type sub-detector module in accordance with an embodiment of the present invention.

FIG. 3(e) illustrates a schematic diagram of circuits of a third type sub-detector module 330, which comprises two inverters I35, I36, a third type level shifter M33, and a fourth type level shifter M34. The third type sub-detector module 330 inputs an input voltage $V_{in}$ to an input end of the inverter I35, and generates an output voltage $V_{out}$ at an output end of the fourth type level shifter M34 as an indication signal.

The inverter I35 comprises a P-channel MOSFET P331 and an N-channel MOSFET N331, and an output end thereof is designated node S331. The inverter I36 comprises a P-channel MOSFET P332 and an N-channel MOSFET N332, and an output end thereof is designated node S332. Power of the inverters I35 and I36 is supplied by $V_{ML}$ and $V_{MH}$.

The third type level shifter M33 of the third type sub-detector module 330 comprises two P-channel MOSFETs P333 and P334, and two N-channel MOSFETs N333 and N334. The P-channel MOSFET P333 and the N-channel MOSFET N333 are connected at a node S333, and the P-channel MOSFET P334 and the N-channel MOSFET P334 are connected at a node S334. Power of the third type level shifter M33 is supplied by $V_{MH}$ and $V_{ss}$.

The fourth type level shifter M34 of the third type sub-detector module 330 comprises two P-channel MOSFET P335 and P336, and two N-channel MOSFET N335 and N336. The P-channel MOSFET P335 and the N-channel MOSFET N335 are connected at a node S335, and the P-channel MOSFET P336 and the N-channel MOSFET N336 are connected at a node S336. Power of the fourth type level shifter M34 is supplied by $V_{dd}$ and $V_{ss}$. The input voltage $V_{in}$ is one of $V_{dd}$, $V_{MH}$, $V_{ML}$, and $V_{ss}$, wherein $V_{dd} > V_{MH} > V_{mL} > V_{ss}$.

Please refer to FIG. 3(f). FIG. 3(f) is a table of the input voltage $V_{in}$ of the third type sub-detector module 330 corresponding to the nodes S331, S332, S333, S334, S335, and S336 and the output voltage $V_{out}$. For clarity, FIG. 3(f) shows the circuit modules comprising the nodes S331, S332, S333, S334, S335, and S336 are enclosed by circular dashed lines, respectively.

Each row of the table in FIG. 3(f) respectively represents situations of the input voltage $V_{in}$ being $V_{dd}$, $V_{MH}$, $V_{ML}$, and $V_{ss}$ in sequence. When $V_{dd}$, $V_{MH}$, $V_{ML}$, and $V_{ss}$ are respectively inputted as the input voltage $V_{in}$ to the third type sub-detector module 330, the corresponding output voltage $V_{out}$ is respectively $V_{dd}$, $V_{dd}$, $V_{ss}$, and $V_{ss}$, as shown in the table. In other words, when the input voltage $V_{in}$ of the third type sub-detector module 330 is $V_{dd}$ or $V_{MH}$, the output voltage $V_{out}$ is $V_{dd}$, i.e., the digital indication signal bit is "1"; when the input voltage $V_{in}$ of the third type sub-detector module 330 is $V_{ML}$ or $V_{ss}$, the output voltage $V_{out}$ is $V_{ss}$, i.e., the digital indication signal bit is "0".

The inverters I35 and I36 in a steady state do not generate any static current. Further, when the P-channel MOSFET P333 of the third type level shifter M33 receives $V_{MH}$ at its gate, the P-channel MOSFET P333 is completely turned off; when the P-channel MOSFET P334 receives $V_{ML}$ at its gate, the N-channel MOSFET N334 is completely turned off.

When the N-channel MOSFET N335 of the fourth type level shifter M34 receives $V_{MH}$ at its gate, the P-channel MOSFET P335 is completely turned off; when the N-channel MOSFET N336 receives $V_{ss}$ at its gate, the N-channel MOSFET N336 is completely turned off. Therefore, the third type level shifter M33 and the fourth type level shifter M34 of the third type sub-detector module 330 in the steady state do not generate any static current.

Figure 4A:
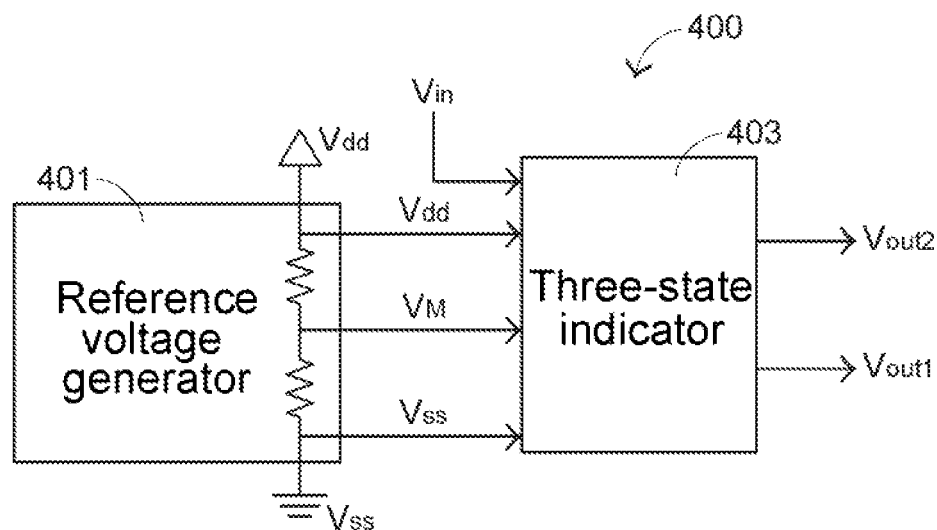
FIG. 4(a) and FIG. 4(b) are respectively a block diagram of a three-state indicator and a schematic diagram of voltage segments of an output voltage of the three-state indicator in accordance with an embodiment of the present invention.
Figure 4B:
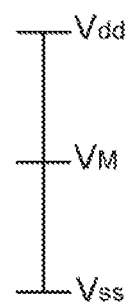

FIG. 4(a) and FIG. 4(b) are schematic diagrams of a three-state indicator 400 according to an embodiment of the present invention. The three-state indicator 400 comprises a reference voltage generator 401 and a three-state detector 403. The reference voltage generator 401 outputs three types of voltages $V_{dd}$, $V_M$, and $V_{ss}$ to the three-state detector 403. An input voltage $V_{in}$ of the three-state detector 403 can be one of $V_{dd}$, $V_M$, and $V_{ss}$, and an indication signal ($V_{out2}$, $V_{out1}$) is generated for identifying the input voltage $V_{in}$. The reference voltage generator 401 only needs to input the voltages $V_{dd}$, $V_M$, and $V_{ss}$ into the three-state detector 403. For example, the reference voltage generator 401 generates $V_{dd}$, $V_M$, and $V_{ss}$ via voltage dividing of resistors.

Figures 4C, 4D:
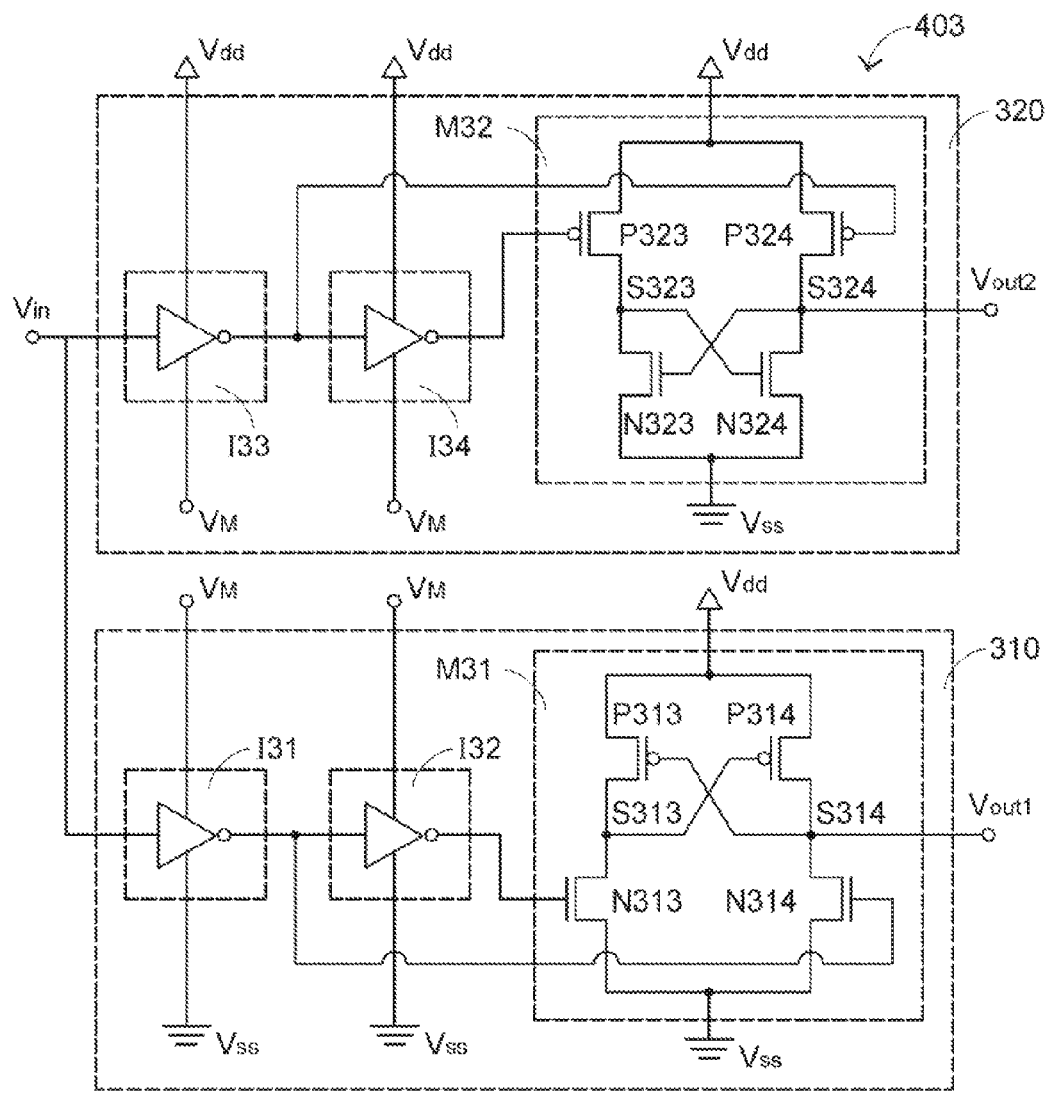
FIG. 4(c) is a schematic diagram of detailed circuits of a three-state detector in accordance with an embodiment of the present invention.
FIG. 4(d) is a schematic diagram of an output voltage of a three-state detector circuit corresponding to an indication signal in accordance with an embodiment of the present invention.

Please refer to FIG. 4(c). FIG. 4(c) is a schematic diagram of circuits of the three-state detector 403 according to an embodiment of the present invention. The three-state detector 403 is designed based on the above first type sub-detector module 310 and the second type sub-detector module 320. For brevity, the inverters I33, I34, I31, and I32 of the three-state detector 403 are directly marked as basic units, and detailed narrations of circuits thereof are omitted herein.

Besides the inverters, the three-state detector 403 further comprises a first type level shifter M31 and a second type level shifter M32. Power of the inverters I31 and I32 is supplied by $V_M$ and $V_{ss}$. Power of the inverters I33 and I34 is supplied by $V_{dd}$ and $V_M$, and power of the first type level shifter M31 and the second type level shifter M32 is supplied by $V_{dd}$ and $V_{ss}$.

Please refer to FIG. 4(d). FIG. 4(d) is a table of an indication signal ($V_{out2}$, $V_{out1}$) respectively corresponding to $V_{dd}$, $V_M$, and $V_{ss}$ as the input voltage $V_{in}$ of the three-state detector 403 in FIG. 4(c). When the indication signal ($V_{out2}$, $V_{out1}$) is (1, 1), i.e., ($V_{dd}$, $V_{dd}$), the input voltage $V_{in}$ is $V_{dd}$. When the indication signal ($V_{out2}$, $V_{out1}$) is (0, 1), i.e., ($V_{ss}$, $V_{dd}$), the input voltage $V_{in}$ is $V_M$. When the indication signal ($V_{out2}$, $V_{out1}$) is (0, 0), i.e., ($V_{ss}$, $V_{ss}$), the input voltage $V_{in}$ is $V_{ss}$.

Figure 5A:
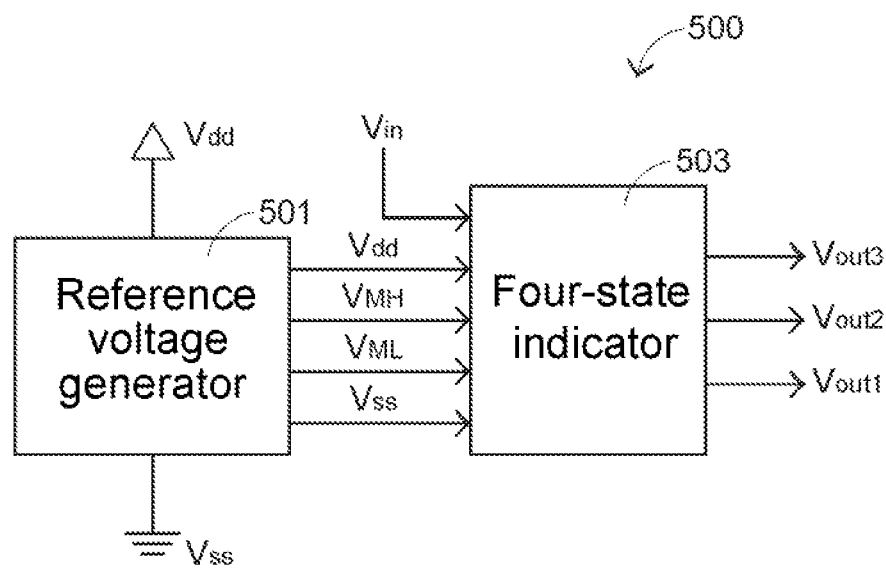
FIG. 5(a) and FIG. 5(b) are respectively a block diagram of a four-state indicator and a schematic diagram of voltage segments of an output voltage of the four-state indicator in accordance with an embodiment of the present invention.
Figure 5B:
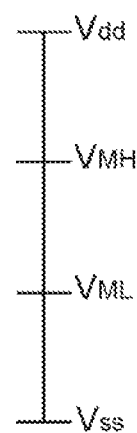

Please refer to FIG. 5(a) and FIG. 5(b). FIG. 5(a) and FIG. 5(b) are schematic diagrams of a four-state indicator 500 according to an embodiment of the present invention. The four-state indicator 500 comprises a reference voltage generator 501 and a four-state detector 503. The reference voltage generator 501 outputs four voltages $V_{dd}$, $V_{MH}$, $V_{ML}$, and $V_{ss}$ to the four-state detector 503. An input voltage $V_{in}$ of the four-state detector 503 can be one of the four voltages $V_{dd}$, $V_{MH}$, $V_{ML}$, and $V_{ss}$, which is identified according to an indication signal ($V_{out3}$, $V_{out2}$, $V_{out1}$).

Figure 5C:
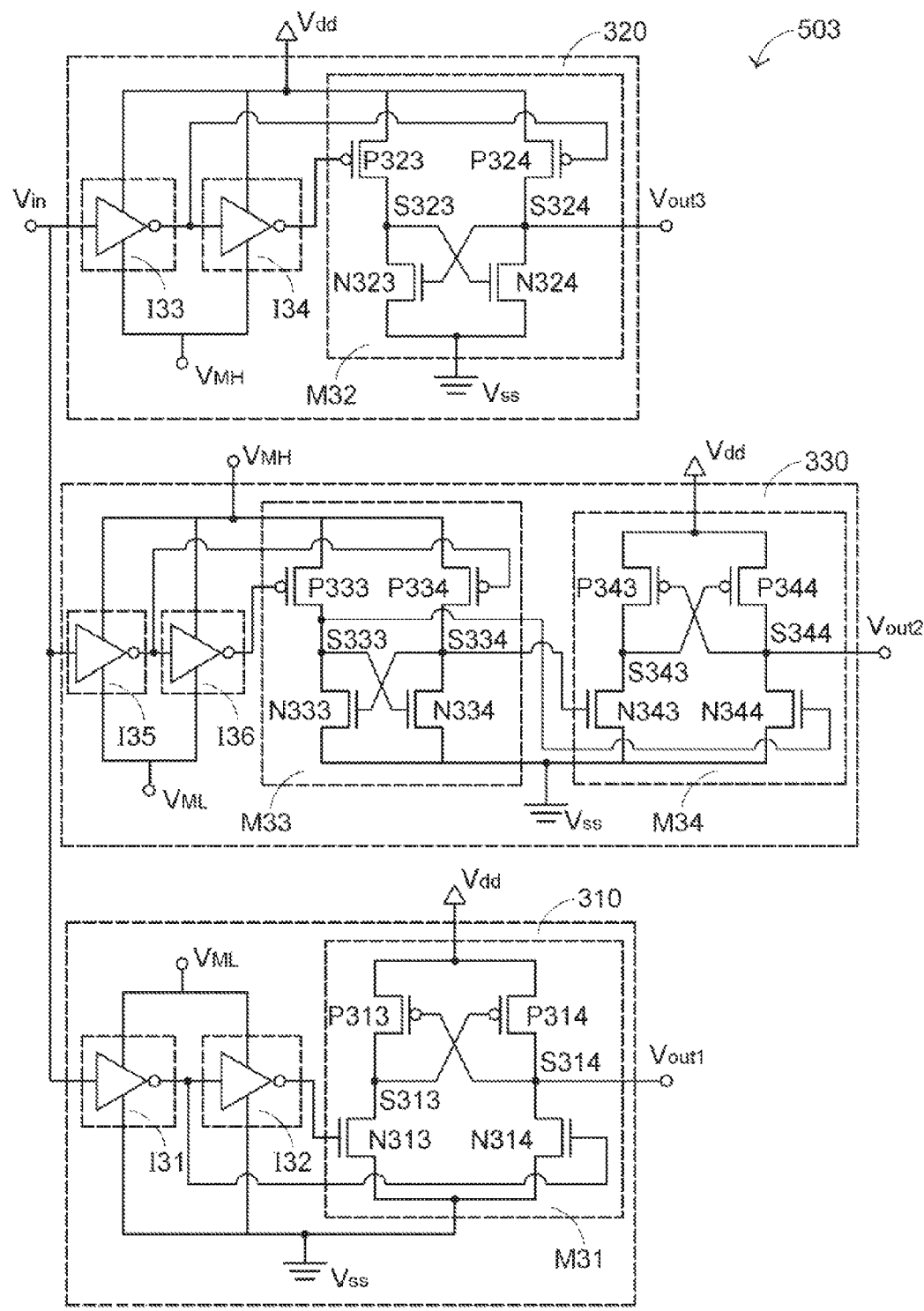
FIG. 5(c) is a schematic diagram of detailed circuits of a four-state detector in accordance with an embodiment of the present invention.

FIG. 5(c) is a schematic diagram of detailed circuits of the four-state detector 503 according to an embodiment of the present invention. The four-state detector 503 comprises the above first type sub-detector module 310, the second type sub-detector module 320 and the third type sub-detector module 330. The three voltages received by the first type sub-detector module 310 are $V_{dd}$, $V_{ML}$, and $V_{ss}$, and three voltages received by the second type sub-detector module 320 are $V_{dd}$, $V_{MH}$, and $V_{ss}$.

For brevity, inverters I33, I34, I31, I32, I35, and I36 of the four-sate detector 503 are directly marked as basic units, and detailed narrations of circuits thereof are omitted herein. The four-state detector 503 further comprises a first type level shifter M31, a second type level shifter M32, a third type level shifter M33, and a fourth type level shifter M34. The above sub-detector modules are implemented by the inverters and the level shifters.

Please refer to FIG. 5(d). FIG. 5(d) is a table of the indication signal ($V_{out3}$, $V_{out2}$, $V_{out1}$) corresponding to $V_{dd}$, $V_{MH}$, $V_{ML}$, and $V_{ss}$ as the input voltage $V_{in}$ of the four-state detector 503 in FIG. 5(c). When the indication signal ($V_{out3}$, $V_{out2}$, $V_{out1}$) is (1, 1, 1), i.e., ($V_{dd}$, $V_{dd}$, $V_{dd}$), the input voltage $V_{in}$ is $V_{dd}$. When the indication signal ($V_{out1}$, $V_{out2}$, $V_{out1}$) is (0, 1, 1), i.e., ($V_{ss}$, $V_{dd}$, $V_{dd}$), the input voltage $V_{in}$ is $V_{MH}$. When the indication signal ($V_{out3}$, $V_{out2}$, $V_{out1}$) is (0, 0, 1), i.e., ($V_{ss}$, $V_{ss}$, $V_{dd}$), the input voltage $V_{in}$ is $V_{ML}$. When the indication signal ($V_{out3}$, $V_{out2}$, $V_{out1}$) is (0, 0, 0), i.e., ($V_{ss}$, $V_{ss}$, $V_{ss}$), the input voltage $V_{in}$ is $V_{ss}$.

The present invention significantly eliminates the static current by implementing inner circuits of a multi-state indicator with level shifters, and has an advantage because a level shifter occupies less area than a differential comparator. Please note that formations of the level shifter are diversified, and the present invention is not limited to the above level shifters while implementing the detector, that is to say, other types of level shifters are also applicable.

Although the embodiments according to the present invention merely take three-state indicators and four-state indicators as examples, for illustrating a conception of implementing a multi-indicator with level shifters, similar approaches evolved from the conception are capable of implementing circuit modules of level shifters in circuit designs of other multi-state indicators.

In order to eliminate static currents and over-large circuit area of a multi-state indicator with a differential comparator, a level shifter is implemented to realize the multi-state indicator. A design adopting the level shifter is capable of avoiding penetration currents when an output end of an open circuit is connected to a high-voltage power supplier, so as to reduce power consumption and noises. On the other hand, since complexity of a level shifter circuit is lower than that of a differential comparator, the level shifter design also outruns while reduction of circuit area is considered.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A three-state indicator, comprising:
   a voltage generator, for generating a first voltage, a second voltage, and a third voltage;
   a three-state detector having a voltage input end coupling to the voltage generator for receiving the first voltage, the second voltage, and the third voltage, wherein the voltage input end selectively receives the first voltage, the second voltage, or the third voltage to generate an indication signal indicating an input voltage at the voltage input end, wherein the indication signal is a two-bit indication signal, and the input voltage is the first voltage, the second voltage, or the third voltage;
   a first type sub-detector module, connected to the voltage generator, for receiving the first voltage, the second voltage, and the third voltage, and for outputting a first bit of the two-bit indication signal, wherein the first bit is at a low level when the input voltage is the first voltage, and the first bit is at a high level when the input voltage is the second voltage or the third voltage; and
   a second type sub-detector module, connected to the voltage generator, for receiving the first voltage, the second voltage, and the third voltage, and for outputting a second bit of the two-bit indication signal, wherein the second bit is at the low level when the input voltage is the first voltage or the second voltage, and the second bit is at the high level when the input voltage is the third voltage;
   wherein the first voltage is smaller than the second voltage, the second voltage is smaller than the third voltage.

2. The three-state indicator of claim 1, wherein the first type sub-detector module comprises:
   a first inverter, having a first inverter input end, a first inverter output end, and being powered by the first voltage and the second voltage, wherein the first inverter input end receives the input voltage;

a second inverter, having a second inverter input end, a second inverter output end, and being powered by the first voltage and the second voltage, wherein the second inverter input end is coupled to the first inverter output end; and a first type level shifter, having two input ends respectively coupled to the first inverter output end and the second inverter output end, and being powered by the first voltage and the third voltage;

wherein, when the input voltage is the first voltage, the first type level shifter outputs the first voltage as the low level; when the input voltage is the second voltage, the first type level shifter outputs the third voltage as the high level; and when the input voltage is the third voltage, the first type level shifter outputs the third voltage as the high level.

3. The three-state indicator of claim 2, wherein the first type level shifter comprises:

a first P-channel metal-oxide-semiconductor field effect transistor (MOSFET), having a source for receiving the third voltage;

a second P-channel MOSFET, having a source for receiving the third voltage, a gate connected to a drain of the first P-channel MOSFET, and a drain connected to a gate of the first P-channel MOSFET, for generating the first bit of the two-bit indication signal;

a first N-channel MOSFET, having a gate connected to the output end of the second inverter, a drain connected to a drain of the first P-channel MOSFET, and a source for receiving the first voltage; and a second N-channel MOSFET, having a gate connected to the output end of the first inverter, a drain connected to the drain of the second P-channel MOSFET, and a source for receiving the first voltage.

4. The three-state indicator of claim 3, wherein the second type sub-detector module comprises:

a third inverter, having a third inverter input end, a third inverter output end, and being powered by the second voltage and the third voltage, wherein the third inverter input end receives the input voltage;

a fourth inverter, having a fourth inverter input end, a fourth inverter output end, and being powered by the second voltage and the third voltage, wherein the fourth inverter input end connects to the third inverter output end; and a second type level shifter, having two input ends respectively connected to the third inverter output end and the fourth inverter output end, and being powered by the first voltage and the third voltage;

wherein, when the input voltage is the first voltage, the second type level shifter outputs the first voltage as the low level; when the input voltage is the second voltage, the second type level shifter outputs the first voltage as the low level; and when the input voltage is the third voltage, the second type level shifter outputs the third voltage as the high level.

5. The three-state indicator of claim 4, wherein the second type level shifter comprises:

a third P-channel MOSFET, having a gate connected to the output end of the fourth inverter, and a drain for receiving the third voltage;

a fourth P-channel MOSFET, having a source for receiving the third voltage, a gate connected to the output end of the third inverter, and a drain for outputting the second bit of the two-bit indication signal;

a third N-channel MOSFET, having a gate connected to the drain of the fourth P-channel MOSFET, a drain connected to a drain of the third P-channel MOSFET, and a source for receiving the first voltage; and a fourth N-channel MOSFET, having a gate connected to the drain of the third P-channel MOSFET, a drain connected to the drain of the fourth P-channel MOSFET, and a source for receiving the first voltage.

6. A multi-state indicator, comprising:

a voltage generator, for generating, from small to large, a first voltage, a second voltage, a third voltage, and a fourth voltage, a multi-state detector, coupled to the voltage generator, for receiving the first voltage, the second voltage, the third voltage, and fourth voltage, having a voltage input end for receiving an input voltage to generate an indication signal whereby the indication signal is of indicating the input voltage with reference to the first voltage, the second voltage, the third voltage, and fourth voltage, wherein the indication signal is an indication signal having 3 bits for identifying the input voltage, and the input voltage is selectively one of the first voltage, the second voltage, the third voltage, and the fourth voltage;

a first type sub-detector module, connected to the voltage generator, for receiving the first voltage, the second voltage, and the fourth voltage, and for outputting a first bit of the three-bit indication signal wherein the first bit is at a low level when the input voltage is the first voltage, and the first bit is at a high level when the input voltage is the second voltage, the third voltage or the fourth voltage;

a second type sub-detector module, connected to the voltage generator, for receiving the first voltage, the third voltage, and the fourth voltage, and for outputting a third bit of the three-bit indication signal, wherein the third bit is at a low level when the input voltage is the first voltage, the second voltage, or the third voltage, and the third bit is at a high level when the input voltage is the fourth voltage; and a third type sub-detector module, connected to the voltage generator, for receiving the first voltage, the second voltage, the third voltage, and the fourth voltage, and for outputting a second bit of the three-bit indication signal, wherein the second bit is at a low level when the input voltage is the first voltage or the second voltage and is at a high level when the input voltage is the third voltage or the fourth voltage.

7. The multi-state indicator of claim 6, wherein the first type sub-detector module comprises:

a first inverter, having a first inverter input end, a first inverter output end, and being powered by the first voltage and the second voltage, wherein the first inverter input end receives the input voltage;

a second inverter, having a second inverter input end, a second inverter output end, and being powered by the first voltage and the second voltage, wherein the first inverter output end connects to the second inverter input end; and a first type level shifter, having two input ends respectively connected to the first inverter output end and the second inverter output end, and being powered by the first voltage and the fourth voltage;

wherein, when the input voltage is the first voltage, the first type level shifter outputs the first voltage as the low level; and when the input voltage is the second voltage, the third voltage or the fourth voltage, the first type level shifter outputs the fourth voltage as the high level.

8. The multi-state indicator of claim 7, wherein the first type level shifter comprises:

a first transistor, a second transistor, a third transistor and a fourth transistor, each comprising a control, a first end and a second end;

wherein, the first end of the first transistor and the first end of the second transistor are coupled to the fourth voltage, the first end of the third transistor and the first end of the fourth transistor are coupled to the first voltage, the control end of the third transistor and the control end of the fourth transistor are respectively coupled to the output end of the second inverter and the output end of the first inverter, the second end of the first transistor and the control end of the second transistor are coupled to the second end of the third transistor, and the control end of the first transistor and the second end of the second transistor are coupled to the second end of the fourth transistor as the first bit of the three-bit indication signal.

9. The multi-state indicator of claim 8, wherein the second type sub-detector module comprises:

a third inverter, having a third inverter input end, a third inverter output end, and being powered by the third voltage and the fourth voltage, wherein the third inverter input end receives the input voltage;

a fourth inverter, having a fourth inverter input end, a fourth inverter output end, and being powered by the third voltage and the fourth voltage, wherein the third inverter output end connects to the fourth inverter input end; and a second type level shifter, having two input ends respectively connected to the third inverter output end and the fourth inverter output end, and being powered by the first voltage and the fourth voltage;

wherein, when the input voltage is the first voltage, the second voltage or the third voltage, the second type level shifter outputs the first voltage as the low level; and when the input voltage is the fourth voltage, the second type level shifter outputs the fourth voltage as the high level.

10. The multi-state of claim 9, wherein the second type level shifter comprises:

a first transistor, a second transistor, a third transistor and a fourth transistor, each comprising a control end, a first end, and a second end;

wherein, the first end of the first transistor and the first end of the second transistor are coupled to the fourth voltage; the first end of the third transistor and the first end of the fourth transistor are coupled to the first voltage; the control end of the first transistor and the control end of the second transistor are respectively coupled to the output end of the fourth inverter and the output end of the third inverter; the second end of the first transistor and the second end of the third transistor are coupled to the control end of the fourth transistor; and the second end of the second transistor and the control end of the third transistor are coupled to the second end of the fourth transistor as the third bit of the three-bit indication signal.

11. The multi-state indicator of claim 10, wherein the third type sub-detector module comprises:

a fifth inverter, having a fifth inverter input end, a fifth inverter output end, and being powered by the second voltage and the third voltage, wherein the fifth inverter input end receives the input voltage;

a sixth inverter, having a sixth inverter input end, a sixth inverter output end, and being powered by the second voltage and the third voltage, wherein the fifth inverter output end connects to the sixth inverter input end;

a third type level shifter, having two input ends and two output ends, with the input ends being respectively connected to the fifth inverter output end and the sixth inverter output end, and being powered by the first voltage and the third voltage; and a fourth type level shifter, having two input ends respectively connected to the output ends of the third type level shifter, and power of the fourth type level shifter being supplied by the first voltage and the fourth voltage, wherein, when the input voltage is the first voltage or the second voltage, the fourth type level shifter outputs the first voltage as the low level; and when the input voltage is the third voltage or the fourth voltage, the fourth type level shifter outputs the fourth voltage as the high level.

12. The multi-state indicator of claim 11, wherein the third type level shifter comprises:

a first transistor, a second transistor, a third transistor, and a fourth transistor, each comprising a control end, a first end, and a second end, wherein, the first end of the first transistor and the first end of the second transistor are coupled to the third voltage; the first end of the third transistor and the first end of the fourth transistor are coupled to the first voltage; the control end of the first transistor and the control end of the second transistor are respectively coupled to the output end of the sixth inverter and the output end of the fifth inverter; the second end of the first transistor and the second end of the third transistor are coupled to the control end of the fourth transistor as a first output end of the third type level shifter; and the second end of the second transistor and the control end of the third transistor are coupled to the second end of the fourth transistor as a second output end of the third type level shifter.

13. The multi-state indicator of claim 12, wherein the fourth type level shifter comprises:

a fifth transistor, a sixth transistor, a seventh transistor, and an eighth transistor, each comprising a control end, a first end, and a second end;

wherein, the first end of the fifth transistor and the first end of the sixth transistor are coupled to the fourth voltage; the first end of the seventh transistor and the first end of the eighth transistor are coupled to the first voltage; the control end of the seventh transistor and the control end of the eighth transistor are respectively coupled to the second output end and the first output end of the third type level shifter; the second end of the fifth transistor and the control end of the sixth transistor are coupled to the second end of the seventh transistor, and the control end of the fifth transistor and the second end of the sixth transistor are coupled to the second end of the eighth transistor as the second bit of the three-bit indication signal.

* * * * *